United States Patent
Mackey et al.

(10) Patent No.: US 9,093,579 B2
(45) Date of Patent: Jul. 28, 2015

(54) DIELECTRIC BARRIERS FOR PIXEL ARRAYS

(75) Inventors: Jeffrey Mackey, Danville, CA (US); Ulrich Boettiger, Garden City, ID (US); Mattia Cichocki, Rome (IT); Loriston Ford, Nampa, ID (US); Rick Holscher, Boise, ID (US); Mitchell J. Mooney, Star, ID (US); Brian Vaartstra, Nampa, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 167 days.

(21) Appl. No.: 13/294,951

(22) Filed: Nov. 11, 2011

(65) Prior Publication Data

US 2012/0273906 A1  Nov. 1, 2012

Related U.S. Application Data

(60) Provisional application No. 61/480,352, filed on Apr. 28, 2011.

(51) Int. Cl.
*H01L 31/0232* (2014.01)
*H01L 31/0216* (2014.01)
*H01L 27/144* (2006.01)
*H01L 27/146* (2006.01)

(52) U.S. Cl.
CPC ...... *H01L 31/02327* (2013.01); *H01L 27/1446* (2013.01); *H01L 27/1464* (2013.01); *H01L 27/14605* (2013.01); *H01L 27/14621* (2013.01); *H01L 27/14629* (2013.01); *H01L 27/14685* (2013.01); *H01L 31/02162* (2013.01)

(58) Field of Classification Search
CPC ............ H01L 31/02327; H01L 31/02164; H01L 31/0232; H01L 27/1446; H01L 27/14605; H01L 27/14623; H01L 27/14629; H01L 27/14685; H01L 31/02162
USPC .......... 257/432, E31.127, 435, 436, E23.127; 438/70, 72
See application file for complete search history.

(56) References Cited

U.S. PATENT DOCUMENTS

| | | | |
|---|---|---|---|
| 6,255,640 B1 * | 7/2001 | Endo et al. ................. | 250/208.1 |
| 7,023,034 B2 * | 4/2006 | Kuriyama ..................... | 257/291 |
| 2004/0180461 A1 * | 9/2004 | Yaung et al. .................... | 438/48 |
| 2006/0060896 A1 * | 3/2006 | Kuriyama ..................... | 257/291 |
| 2006/0131598 A1 * | 6/2006 | Koh ................................ | 257/98 |

(Continued)

FOREIGN PATENT DOCUMENTS

| | | | | |
|---|---|---|---|---|
| JP | 2001237405 A | * | 8/2001 | |
| JP | 2005294647 A | * | 10/2005 | |
| WO | WO 2010/010652 A1 | * | 1/2010 | ............. H01L 27/14 |

*Primary Examiner* — Joseph C Nicely
(74) *Attorney, Agent, or Firm* — Treyz Law Group; Joseph F. Guihan

(57) ABSTRACT

Pixel arrays are provided for image sensors that have barriers between color filters in an array of color filters. Color filter barriers may be formed from a transparent or semi-transparent material. Color filter barriers may be formed from a low refractive index material. Color filters may be etched and color filter barrier material may be formed in the etched regions of the color filters. If desired, a layer of color filter barrier material may be etched to form open regions and color filter material may be formed in the open regions of the color filter barrier material. An image sensor may be a front-side illuminated image sensor or a back-side illuminated image sensor.

6 Claims, 8 Drawing Sheets

(56) References Cited

U.S. PATENT DOCUMENTS

| | | | |
|---|---|---|---|
| 2006/0138577 A1* | 6/2006 | Hashimoto | 257/432 |
| 2007/0045511 A1* | 3/2007 | Lee et al. | 250/208.1 |
| 2007/0138380 A1* | 6/2007 | Adkisson et al. | 250/227.11 |
| 2007/0188635 A1* | 8/2007 | Yamaguchi et al. | 348/272 |
| 2007/0237888 A1* | 10/2007 | Liu et al. | 427/58 |
| 2007/0238034 A1 | 10/2007 | Holscher et al. | |
| 2007/0238035 A1 | 10/2007 | Holscher | |
| 2008/0204580 A1 | 8/2008 | Holscher | |
| 2009/0020838 A1* | 1/2009 | Lin et al. | 257/432 |
| 2009/0085137 A1* | 4/2009 | Kuriyama | 257/432 |
| 2009/0090850 A1 | 4/2009 | Liu | |
| 2009/0200622 A1 | 8/2009 | Tai et al. | |
| 2010/0060756 A1* | 3/2010 | Inuiya | 348/280 |
| 2010/0207225 A1* | 8/2010 | Masuda | 257/432 |
| 2010/0245638 A1* | 9/2010 | Ota | 348/280 |
| 2010/0253819 A1* | 10/2010 | Yokozawa | 348/273 |
| 2011/0049591 A1* | 3/2011 | Nakatani et al. | 257/292 |
| 2012/0077300 A1* | 3/2012 | Hashimoto | 438/69 |
| 2012/0313206 A1* | 12/2012 | Nozaki et al. | 257/432 |

\* cited by examiner

DIELECTRIC BARRIERS FOR PIXEL ARRAYS

This application claims the benefit of provisional patent application No. 61/480,352, filed Apr. 28, 2011, which is hereby incorporated by reference herein in its entirety.

BACKGROUND

The present invention relates to color filters for image sensors, and in particular to barriers between color filters in a color filter array.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors have arrays of pixels. Each pixel has a photosensor such as a photodiode.

A color filter array is formed over the photosensors with sensitivity to a certain range of wavelengths. The color filters are typically red, green, or blue color filters that select for red, green, or blue light, respectively.

As technology advances and pixel sizes shrink, the pixels may become less tolerant of variations in the lateral extent of the color filters. Undesirable diffusion or chemical reactions can occur between adjacent color filters. Barriers can sometimes be formed between adjacent color filters. However, image sensors having conventional color filter barriers formed from metal may have performance characteristics that are less than ideal.

It is desirable, depending on the size of an image sensor device, to have improved barriers between color filters in a color filter array.

DETAILED DESCRIPTION

Image sensors may be provided with color filter arrays and color filter barriers between individual colors in the color filter arrays. Color filter arrays having color filter barriers may be provided for complementary metal-oxide-semiconductor (CMOS) image sensors or charge-coupled device (CCD) image sensors. Image sensors may be front-side illumination (FSI) image sensors or back-side illumination (BSI) image sensors.

Figure 1A:
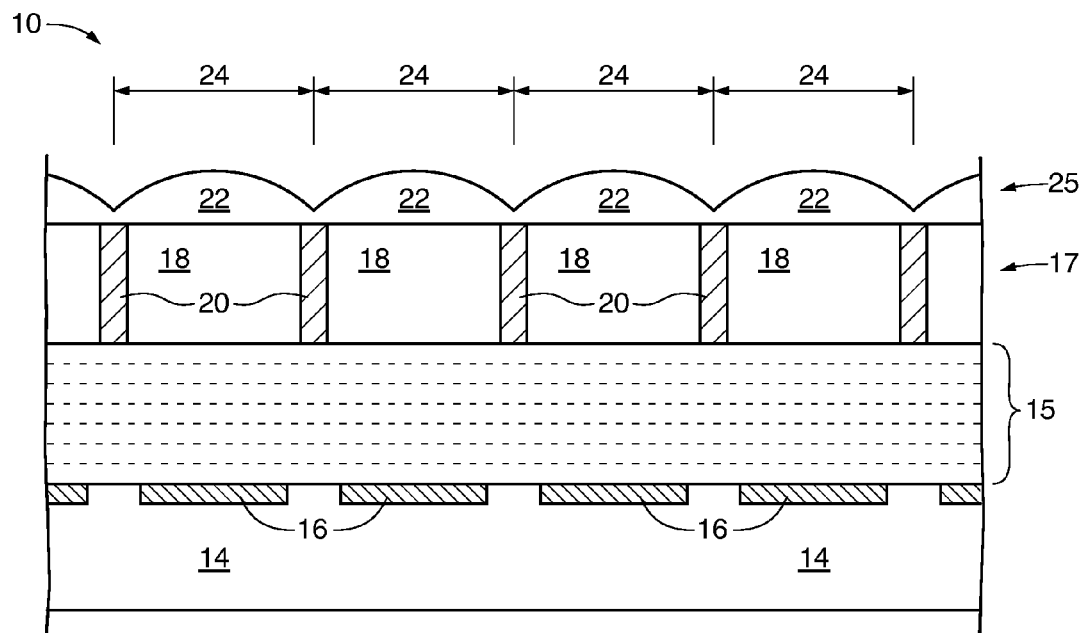
FIG. 1A is a diagram showing a cross-sectional view of an illustrative front-side illumination (FSI) image sensor having color filter barriers in accordance with an embodiment of the present invention.

A cross-sectional side view of an illustrative pixel array for a front-side illumination sensor is shown in FIG. 1A. Pixel array 10 of FIG. 1A may have an array of pixel cells 24. Pixel cells 24 may also be known as pixels. Pixel array 10 may have a substrate such as substrate 14. Substrate 14 may be formed from silicon or other suitable materials. A photosensor such as photodiode 16 may be formed in substrate 14 for each pixel 24. Interconnect layers 15 (also known as dielectric layers, metallization layers, or as a dielectric stack) may be formed above substrate 14 and photodiodes 16. Interconnect layers 15 may have metal and dielectric regions that are used to route signals on pixel array 10. Color filter layer 17 (also known as a color filter array) may be formed above interconnect layers 15. Color filter layer 17 may have color filters such as color filters 18. Color filter layer may have color filter barriers 20 that separate each of the individual color filters 18 in color filter layer 17. Microlenses 22 may be formed above color filter layer 17 in a microlens layer 25 (also known as a microlens array).

Color filter barriers 20 may be formed from a color filter barrier material such as a dielectric material. Color filter barriers 20 may be formed from a transparent or semi-transparent material. Color filter barriers 20 may be formed from a low refractive index material. If desired, color filter barriers 20 may be formed from a material have an refractive index n that is 1.7 or less, 1.1 or greater, or in the range of n=1.1 - 1.7.

Figure 1B:
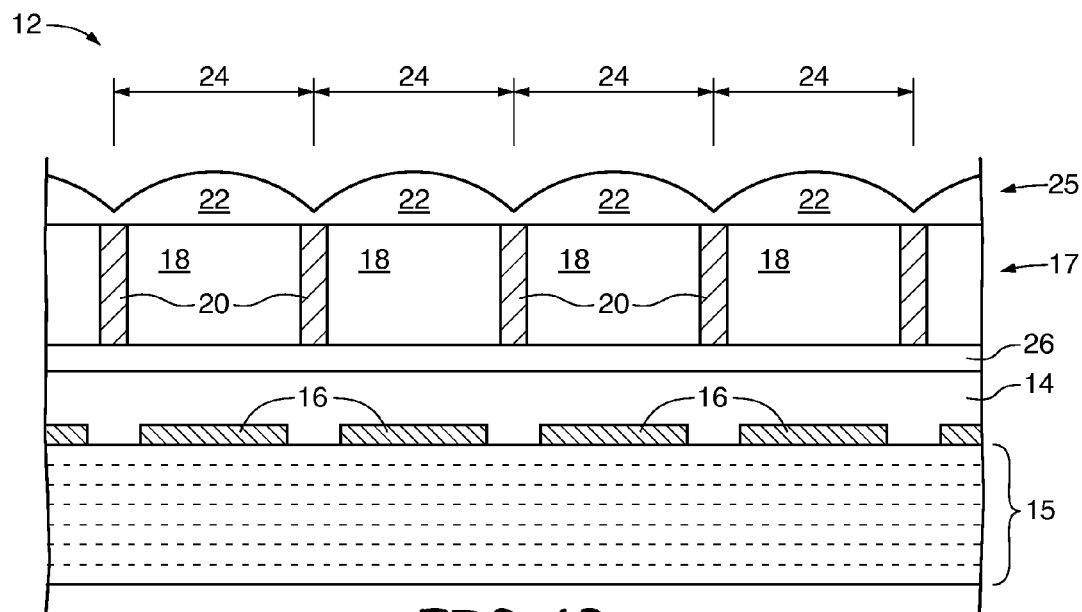
FIG. 1B is a diagram showing a cross-sectional view of an illustrative back-side illumination (BSI) image sensor having color filter barriers in accordance with an embodiment of the present invention.

Color filter arrays having color filter barriers 20 may also be formed in pixel arrays for back-side illumination (BSI) image sensor, as shown in FIG. 1B. Pixel array 12 of FIG. 1B may be a pixel array for a back-side illumination sensor. Photosensors such as photodiodes 16 may be formed in substrate 14. Color filter layer 17 (also known as a color filter array) having color filters 18 and color filter barriers 20 may be formed on substrate 14 on an opposite surface of substrate 14 from photodiodes 16. Layer 26 may be an optional dielectric layer between color filter layer 17 and substrate 14. Interconnect layer 15 may be formed on substrate 14 over photodiodes 16, on the same surface of substrate 14 as photodiodes 16.

Color filter barriers 20 may enhance the optical performance of pixels 24 for front-side illumination and back-side illumination sensors of FIGS. 1A and 1B. The performance of pixels 24 may be enhanced for both on-axis and off-axis incident light. Back-side illumination sensors may experience a significant boost in quantum efficiency at angular incidences. Color filter barriers 20 may improve angular coverage for sensors such as back-side illumination sensors. A maximum angle of incidence may be improved from approximately 27° to approximately 40°, for example. Color filter barrier 20 may improve quantum efficiency for an image sensor without a significant increase in color crosstalk.

The presence of color filter barriers 20 may help reduce variations in the lateral extent of color filters 18. Color filter barriers 20 may act as a diffusion barrier, reducing the possibility of mixing or chemical reactivity between color filters 18.

Barriers 20 may also be formed in a monochrome sensor that does not have color filters material. Barriers 20 may be formed in a layer that is filled by an optically transmitting material. The optically transmitting material may be material that does not filter incident light by color. Microlenses may be over the optically transmitting material. Microlenses may be formed directly on the optically transmitting material. If desired, microlenses may be separated from the optically transmitting material by a separate layer such as a passivation layer, a dielectric layer, or other suitable layer.

Figure 2:
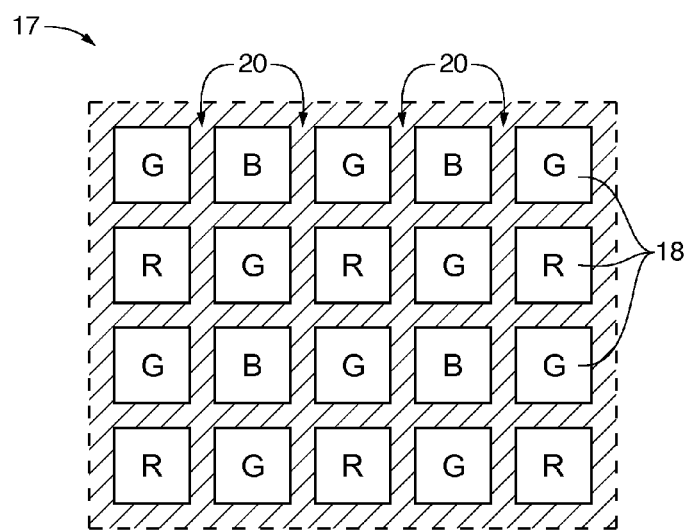
FIG. 2 is a diagram showing a top view of an illustrative color filter layer having color filter barriers in accordance with an embodiment of the present invention.

FIG. 2 is a cross-sectional top view of an illustrative color filter layer such as color filter layer 17 that may be used for pixel array 10 of FIG. 1A or pixel array 12 of FIG. 1B. Color filter layer 17 may have color filters 18. Color filters 18 may be red color filters R, green color filters G, and blue color filters G. Color filters 18 may be arranged in a pattern such as a Bayer pattern as shown in FIG. 2. Color filter barriers 20 may fill spaces in between color filters 18. Color filter barriers 20 may form a grid-like pattern and may be known as a dielectric grid on a color filter layer 17. Color filter barriers 20 may form a box around each individual color filter 18. Color filter barrier 20 may be contiguous across color filter layer 17 and may be referred to as a single color filter barrier. Color filter barrier 20 may be referred to as dielectric separation between color filters 18. Color filter barrier 20 may be referred to as barrier material between color filters 18 or as a container for color filter 18.

Figure 3:
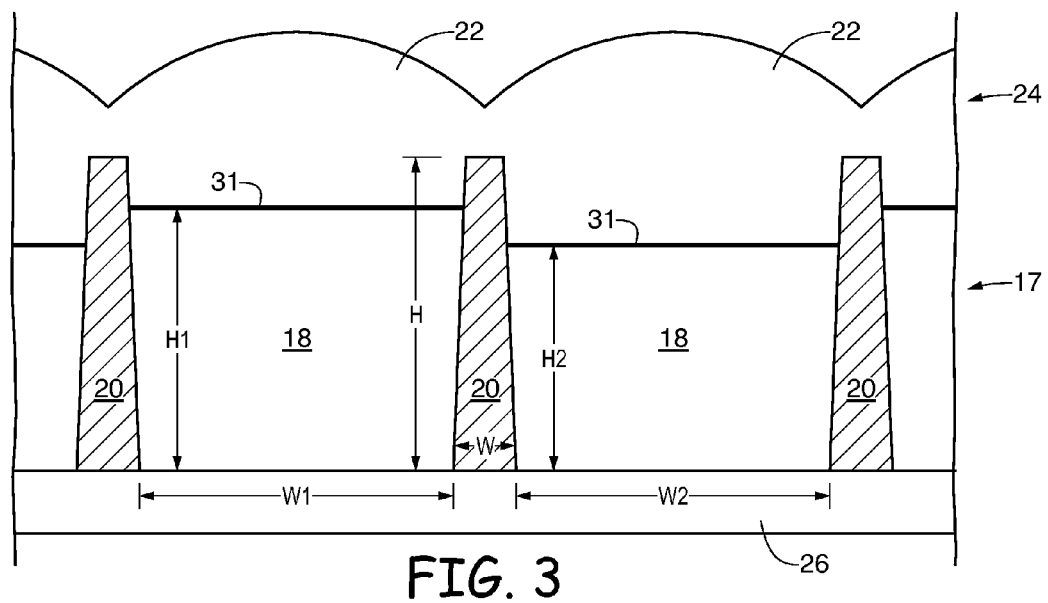
FIG. 3 is a diagram showing a cross-sectional view of an illustrative color filter layer having color filter barriers in accordance with an embodiment of the present invention.

FIG. 3 is a cross-sectional side view of an illustrative color filter layer such as color filter layer 17 having color filter 18. Color filter 17 of FIG. 3 may be used for pixel array 10 of FIG. 1A or pixel array 12 of FIG. 1B. Layer 26 may be a dielectric layer formed from silicon dioxide ($SiO_2$) or other suitable materials. If desired, layer 26 may be an interconnect layer such as one of interconnect layers 15 (see, e.g., FIG. 1A). If desired, layer 26 may be a passivation layer and may be formed from silicon nitride (SiN) or other suitable materials. If desired, color filters 18 may be formed directly on a substrate such as substrate 14 in FIG. 1B. If desired, color filters 18 may have different heights. For example, left-most color filter 18 in FIG. 3 may have height H1 and a width W1. Right-most color filter 18 in FIG. 3 may have a height H2 and a width W2. Color filters 18 may have heights of about 0.5 micron, about 0.8 micron, less than 0.5 micron, less than 1.0 micron, 0.5-1.5 micron, or any suitable heights.

Color filter barriers 20 may be vertical barriers between each individual color filter barrier 18. Barriers 20 may be known as barrier walls. Barriers 20 may be formed of only vertical walls with no horizontal segments between the vertical walls. Barriers 20 may form an open grid. Barriers 20 may form a grid that is open along a top side such as a side closer to microlenses 22. Color filters barriers 20 may have a width W and a height H. If desired, color filter barriers 20 may have a height H that is greater than the heights of color filters 18 or the same as the heights of color filters 18. Color filter barrier height H may be greater than 0.4 micron, in the range of 0.4 micron to 1.0 micron, about 0.5 micron, less than 0.5 micron, less than 0.8 micron, less than 1.0 micron, 0.4-1.5 micron, greater than 0.5 micron, or any suitable height. Color filter barrier width W may be, greater than 0.09 micron, less than 0.15 micron, in the range of 0.09 micron to 0.15 micron, in the range of 0.05 to 0.2 micron, less than 0.2 micron, or any suitable width. In the example of FIG. 3, there is no portion of color filter barriers 20 that extends over top surfaces 31 of color filters 18. In such as example, color filter barriers 20 may be considered as not overlapping color filters 18 in a vertical direction. In the example of FIG. 3, microlenses 22 are directly adjacent to and contacting top surfaces 31 of color filters 18. If desired, intervening layers such as passiviation layers may be formed between microlenses 22 and color filters 18.

If desired, color filter barriers 20 may have slightly slanting sidewalls such that barriers 20 are narrower at the tops of barriers 20 than at the bottoms of barriers 20. Slanting sidewalls of barriers 20 may be an effect of processing conditions. Slanting sidewalls may also be deliberately fabricated, if desired. Barriers 20 may also be fabricated to have straight vertical sidewalls, if desired.

Figure 4:
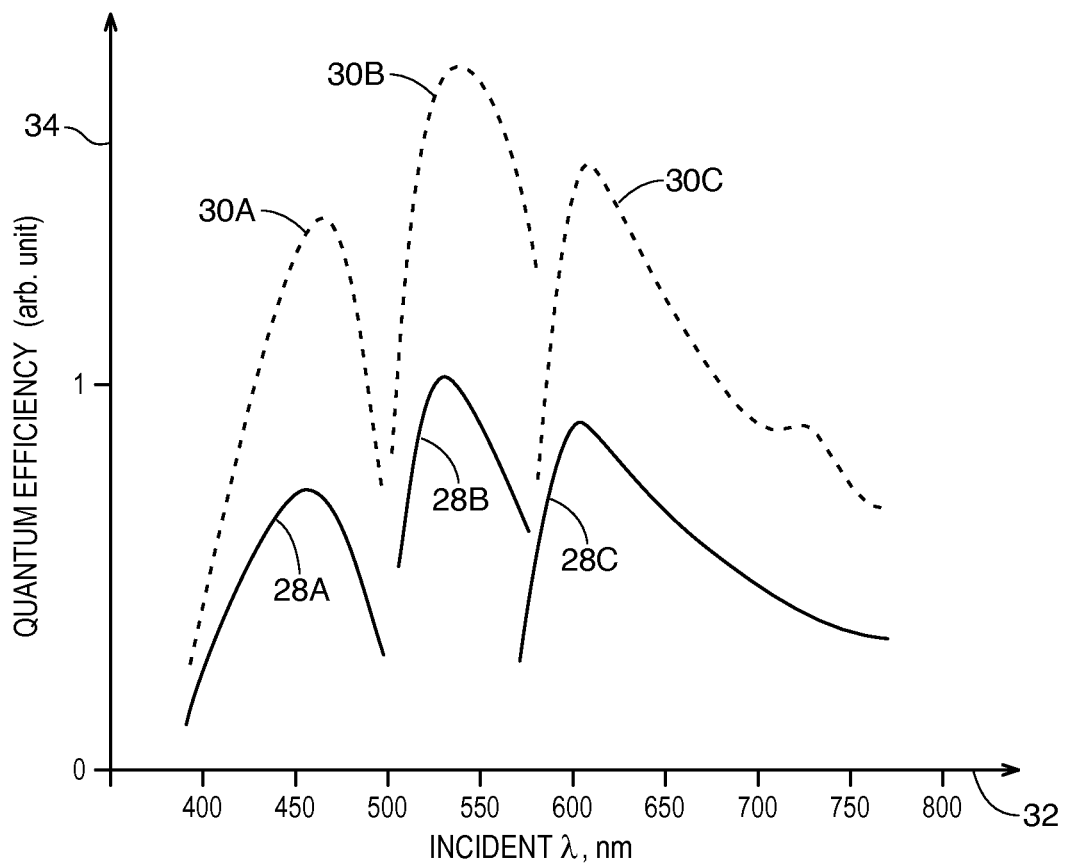
FIG. 4 is an illustrative plot showing how quantum efficiency may improve for image sensors having color filter barriers in accordance with an embodiment of the present invention.

FIG. 4 is a graph showing how quantum efficiency may improve with the use of color filter barriers such as color filter barriers 20. The horizontal axis 23 represents the wavelength of incident light in nanometers. The vertical axis 34 represents quantum efficiency in arbitrary units. Curves 28A, 28B, and 28C represent quantum efficiency for conventional pixels for red pixels 28C, green pixels 28B, and blue pixels 28A. Curves 30A, 30B, and 30C represent quantum efficiency for blue pixels, green pixels, and red pixels, respectively, in a pixel array having color filter barriers such as color filter barriers 20. Curves 28A, 28B, 28C, and 30A, 30B, and 30C may represent quantum efficiency for light incident at a 20° angle on a pixel array. As shown in the example of FIG. 5, color filter barriers such as color filter barriers 20 may significantly increase quantum efficiency for red, green, and blue pixels for light incident at a 20° angle.

Figure 5:
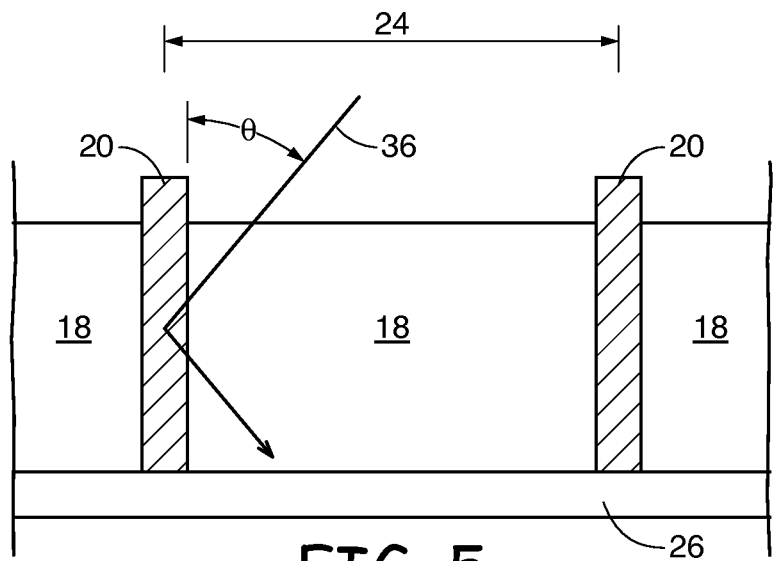
FIG. 5 is a diagram showing an off-axis light ray incidence on an illustrative color filter layer having color filter barriers in accordance with an embodiment of the present invention.

FIG. 5 is a diagram of an illustrative light ray 36 incident on a pixel array having color filter barriers 20. Light ray 36 may be incident on pixel 24 at an angle θ as shown in FIG. 5. Color filter barriers 20 may be formed from a material that is transparent or semi-transparent to visible light. A light ray such as light ray 36 may be reflected off color filter barrier 20 and directed into photodiode 16 (see, e.g., FIG. 1) that is associated with that pixel 24. Color filter barrier 20 may prevent light ray 36 from being incident on a photodiode in an adjacent pixel.

Figure 6A:
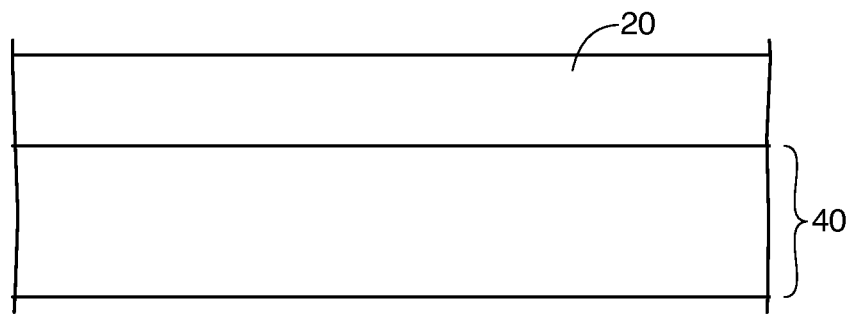
FIG. 6A is a diagram showing color filter barrier material deposited in an illustrative step in forming a pixel array having color filter barriers accordance with an embodiment of the present invention.
Figure 6B:
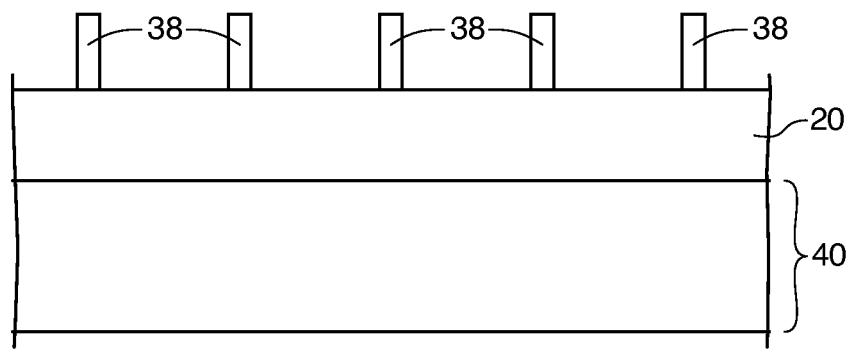
FIG. 6B is a diagram showing patterned resist in an illustrative step in forming a pixel array having color filter barriers accordance with an embodiment of the present invention.

An illustrative process for forming color filter barriers such as color filter barriers 20 is shown in FIGS. 6A-6F. As shown in FIG. 6A, layer of color filter barrier material 20 may be formed on layer 40. For a pixel array for a front-side illumination sensor such as pixel array 10 in FIG. 1A, layer 40 may represent dielectric layers 15 and substrate 14 having photodiodes 16 as in FIG. 1A. For a pixel array for a back-side illumination sensor such as pixel array 12 in FIG. 1B, layer 40 may represent optional layer 26 and substrate 14 having photodiodes 16 as in FIG. 1B. Dielectric layers 15 of FIG. 1B may be formed before or after the steps of FIG. 6A-6F. Color filter barrier material 20 may be silicon dioxide, silicon nitride, polymers, or other dielectrics, oxides, or polymers, if desired. Color filter barrier material 20 may be deposited using a spin-coating process, chemical vapor deposition, or any suitable process.

Figure 6C:
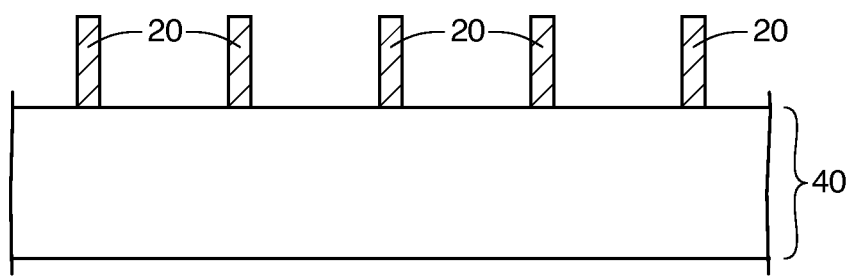
FIG. 6C is a diagram showing etched color filter barriers in an illustrative step in forming a pixel array having color filter barriers accordance with an embodiment of the present invention.

Color filter barrier material 20 may be patterned using photolithography or other suitable processes. A layer of photoresist may be formed above color filter barrier material 20 in a spin-coating process and patterned to form patterned photoresist 38 of FIG. 6B. Color filter barrier material 20 may be etched and patterned resist 38 removed as shown in FIG. 6C. Color filter barriers 20 of FIG. 6C may form a grid-like pattern as shown in the top view of FIG. 2.

Figure 6D:
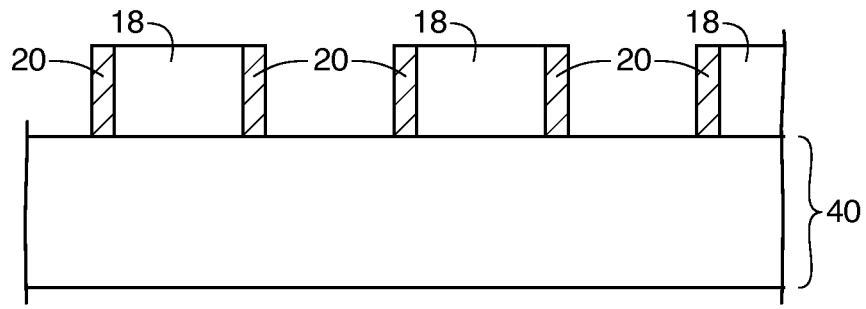
FIG. 6D is a diagram showing the formation of color filters of one color in an illustrative step in forming a pixel array having color filter barriers accordance with an embodiment of the present invention.
Figure 6E:
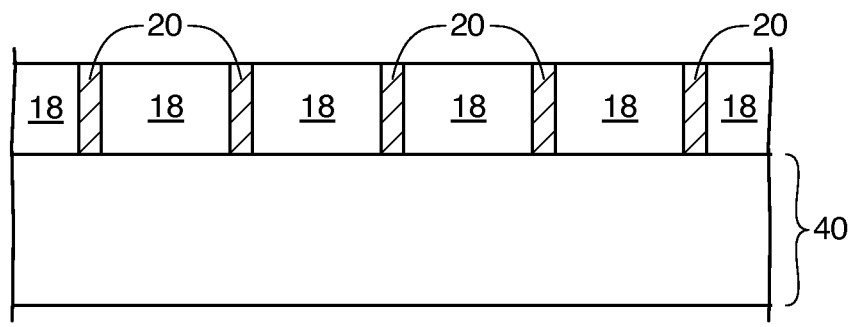
FIG. 6E is a diagram showing the formation of color filters in an illustrative step in forming a pixel array having color filter barriers accordance with an embodiment of the present invention.
Figure 6F:
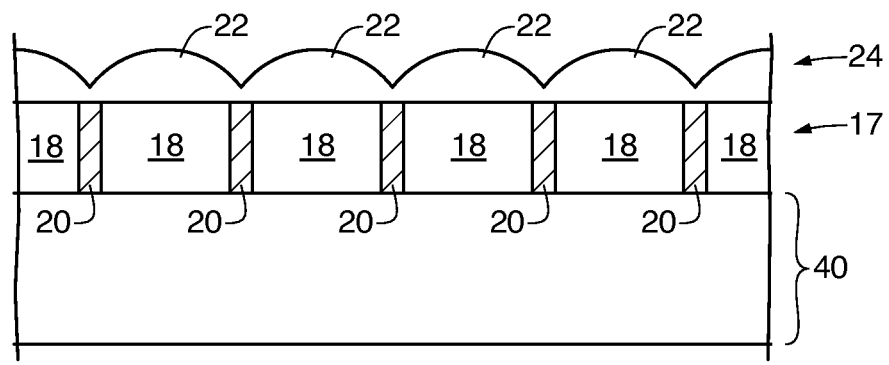
FIG. 6F is a diagram showing the formation of microlenses in an illustrative step in forming a pixel array having color filter barriers accordance with an embodiment of the present invention.

Color filter material 18 may be formed for a first color as shown in FIG. 6D. Color filter material 18 (also known as color filter array material) may be deposited as a spin-on process or other suitable processes. Color filter material 18 may be formed from a photosensitive material such as a photoresist that is cured with light. Color filter material 18 may be formed for other colors, as shown in FIG. 6E. Microlenses 22 in a microlens layer 25 may be formed over color filters 18 and color filter barriers 20, as shown in FIG. 6F.

Another illustrative process for forming a color filter array 17 with color filter barriers 20 is shown in FIGS. 7A-7E. As shown in FIG. 6A, color filters 18 may be formed on layer 40. For a pixel array for a front-side illumination sensor such as pixel array 10 in FIG. 1A, layer 40 may represent dielectric layers 15 and substrate 14 having photodiodes 16 as in FIG. 1A. For a pixel array for a back-side illumination sensor such as pixel array 12 in FIG. 1B, layer 40 may represent optional layer 26 and substrate 14 having photodiodes 16 as in FIG. 1B. Dielectric layers 15 of FIG. 1B may be formed before or after the steps of FIG. 7A-7E.

Figure 7A:
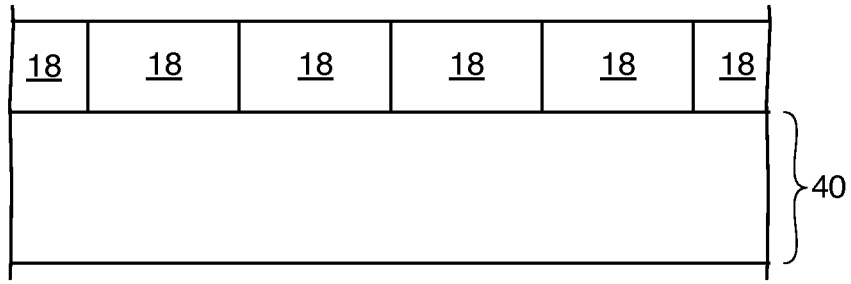
FIG. 7A is a diagram showing the formation of color filters in an illustrative step in forming a pixel array having color filter barriers accordance with an embodiment of the present invention.
Figure 7B:
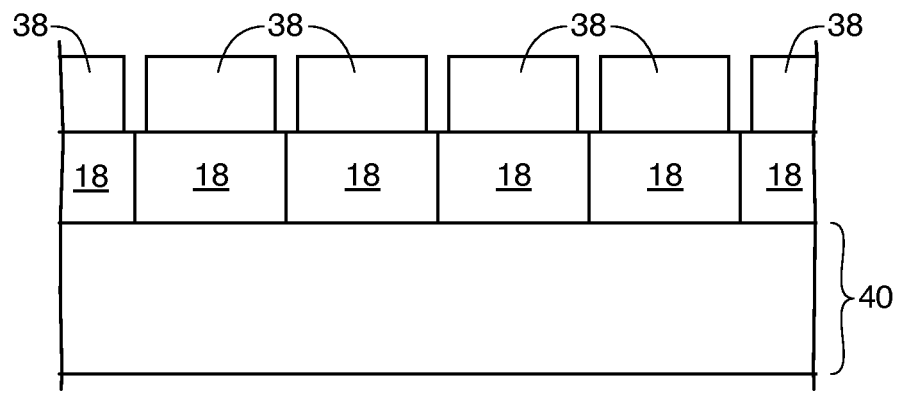
FIG. 7B is a diagram showing patterned resist in an illustrative step in forming a pixel array having color filter barriers accordance with an embodiment of the present invention.
Figure 7C:
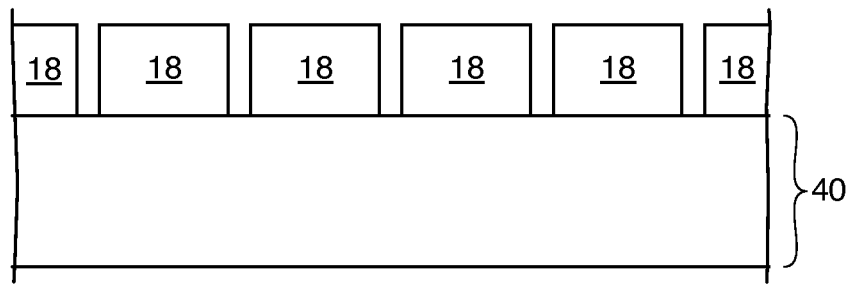
FIG. 7C is a diagram showing etched color filters in an illustrative step in forming a pixel array having color filter barriers accordance with an embodiment of the present invention.
Figure 7D:
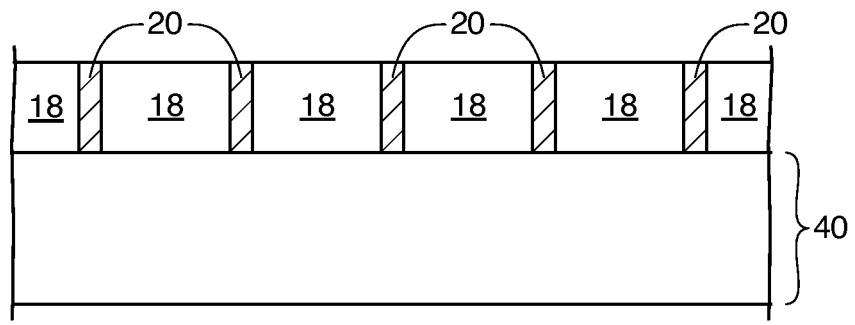
FIG. 7D is a diagram showing color filter barriers in an illustrative step in forming a pixel array having color filter barriers accordance with an embodiment of the present invention.
Figure 7E:
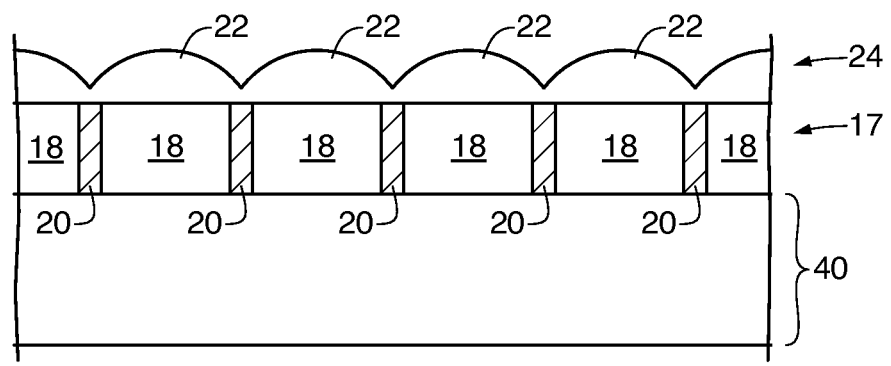
FIG. 7E is a diagram showing microlenses in an illustrative step in forming a pixel array having color filter barriers accordance with an embodiment of the present invention.

Resist may be formed over color filters 18 and patterned to form patterned resist 38 as shown in FIG. 7B. Color filters 18 may be etched and patterned resist 38 removed as shown in FIG. 7C. Color filter barriers 20 may be formed between color filters 18 as shown in FIG. 7D. Color filter barrier material 20 may be deposited using spin-coating, chemical vapor deposition, or any suitable process. Microlenses 22 may be formed in a microlens array 25 over color filters 18 and color filter barriers 20 as shown in FIG. 7E.

Figure 8A:
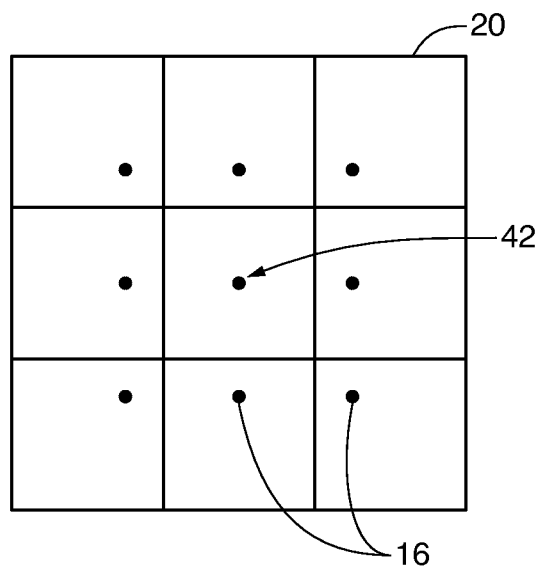
FIG. 8A is a diagram showing barriers that are shifted farther from a center of a pixel array with respect to photodiodes in accordance with an embodiment of the present invention.
Figure 8B:
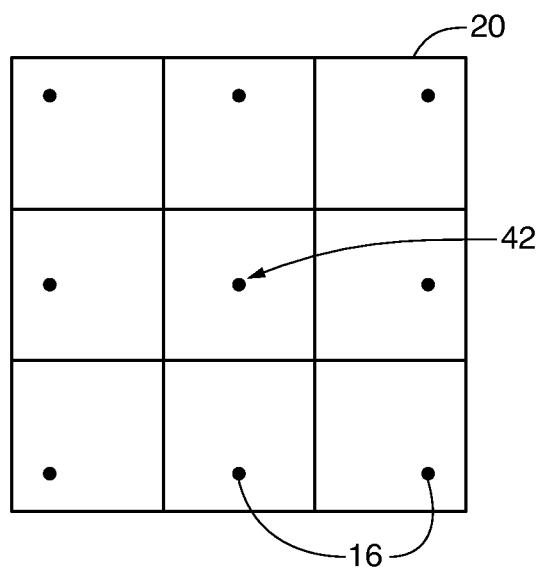
FIG. 8B is a diagram showing barriers that are shifted closer to a center of a pixel array with respect to photodiodes in accordance with an embodiment of the present invention.

In the example of FIGS. 1A and 1B, individual barriers 20 are shown centered over photodiodes 16. If desired, individual barriers 20 may be positioned off-center from photodiodes 16. In particular, barriers 20 may have walls that are shifted with respect to the center of a pixel array in order to compensate for incoming ray angles. For example, as shown in the example of FIG. 8A barriers 20 may be shifted farther from a center 42 of a pixel array with respect to photodiodes 16. If desired, as shown in FIG. 8B, barriers 20 may be shifted closer to a center 42 of a pixel array with respect to photodiodes 16. FIGS. 8A and 8B show a 3×3 pixel array for illustrative purposes. In general, a pixel array may be have thousands, millions (megapixels) or more pixels.

Barrier wall widths such as width W in FIG. 3 may be varied across a pixel array to optimize for incoming ray angles. For example, barrier wall widths W may increase with distance from a center of a pixel array. If desired, barrier wall widths W may decrease with distance from a center of a pixel array.

Barriers 20 may be composed of more than one material or maybe formed from a continuously variable material. For example, barrier 20 may be formed form a material having a refractive index gradient in a vertical direction along a barrier wall. If desired, barrier 20 may be formed from two or more materials with different refractive indices.

Various embodiments have been described illustrating barriers between color filters in a color filter array.

A color filter array may be provided having color filters and barriers between individual color filters. Color filter barriers may have a grid-like structure with vertical walls. Color filter barriers may be present only between color filters and not over color filters. Color filter barriers may be formed so that there is no overlap between color filter barriers and color filters in a vertical direction. Microlenses may be formed in an array over a color filter array. Microlenses may be directly adjacent to color filters, such that no color filter barrier material is between the microlenses and the color filters.

Color filter barriers may be formed from a dielectric material. Color filter barriers may be formed from a low refractive index material with a refractive index in the range of about 1.1 to 1.7. Color filter barriers may be transparent or semi-transparent to visible light.

Suitable processes may be used for forming color filter arrays with color filter barriers. If desired, color filters may be formed first and color filter barriers formed between the color filters. If desired, a color filter barrier layer may be formed first. The color filter barrier layer may be patterned to have open regions and color filters may be formed in the open regions.

The foregoing is merely illustrative of the principles of this invention which can be practiced in other embodiments.

What is claimed is:

1. An array of pixels, comprising:
   a substrate having an array of photodiodes;
   an array of color filters over the array of photodiodes; and
   vertical dielectric walls between the color filters, wherein the dielectric walls do not extend over the color filters and wherein the vertical dielectric walls each have a monotonically increasing refractive index gradient along a vertical direction.

2. The array of pixels defined in claim 1, wherein the vertical dielectric walls each have widths in the range of 0.09 micron to 0.15 micron.

3. The array of pixels defined in claim 1, wherein the vertical dielectric walls each have a height in the range of 0.4 micron to 1.0 micron.

4. An array of pixels, comprising:
   a substrate having an array of photodiodes;
   an array of color filters over the array of photodiodes; and vertical dielectric walls between the color filters, wherein the dielectric walls do not extend over the color filters, wherein the array of photodiodes has a center, and wherein the widths of the dielectric walls increases with increasing distance from the center of the array of photodiodes.

5. The array of pixels defined in claim 4, wherein the vertical dielectric walls each have widths in the range of 0.09 micron to 0.15 micron.

6. The array of pixels defined in claim 4, wherein the vertical dielectric walls each have a height in the range of 0.4 micron to 1.0 micron.

* * * * *